United States Patent
Wasekura

(10) Patent No.: US 8,866,515 B2
(45) Date of Patent: Oct. 21, 2014

(54) DRIVE UNIT FOR DRIVING VOLTAGE-DRIVEN ELEMENT

(75) Inventor: Masaki Wasekura, Toki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/882,594

(22) PCT Filed: Jun. 2, 2011

(86) PCT No.: PCT/JP2011/062720
§ 371 (c)(1),
(2), (4) Date: Apr. 30, 2013

(87) PCT Pub. No.: WO2012/164727
PCT Pub. Date: Dec. 6, 2012

(65) Prior Publication Data
US 2013/0214825 A1    Aug. 22, 2013

(51) Int. Cl.
| H03K 3/00 | (2006.01) |
| G05F 1/00 | (2006.01) |
| H03K 17/296 | (2006.01) |
| H02M 1/08 | (2006.01) |

(52) U.S. Cl.
CPC ............... H03K 17/296 (2013.01); H02M 1/08 (2013.01)
USPC .......................................... 327/109; 327/518

(58) Field of Classification Search
None
See application file for complete search history.

(56) References Cited

U.S. PATENT DOCUMENTS

| 5,986,484 | A  | * | 11/1999 | Kimata ......................... 327/108 |
| 7,057,361 | B2 | * | 6/2006  | Kitahata et al. ............... 318/139 |
| 8,432,715 | B2 | * | 4/2013  | Fukuta et al. ................... 363/98 |
| 8,659,248 | B2 | * | 2/2014  | Miura et al. ............. 318/400.27 |
| 2004/0008530 | A1 | * | 1/2004 | Kitahata et al. ............... 363/131 |
| 2007/0257652 | A1 |   | 11/2007 | Yanagishima |
| 2011/0163706 | A1 | * | 7/2011 | Miura et al. ............. 318/400.27 |
| 2011/0221370 | A1 | * | 9/2011 | Fukuta et al. ............ 318/400.27 |
| 2012/0025897 | A1 |   | 2/2012 | Wasekura |
| 2012/0075753 | A1 | * | 3/2012 | Watanabe et al. ............... 361/18 |
| 2013/0082762 | A1 | * | 4/2013 | Gan et al. ....................... 327/478 |
| 2013/0083576 | A1 | * | 4/2013 | Gan et al. ....................... 363/123 |
| 2013/0175959 | A1 | * | 7/2013 | Fukuta et al. ............ 318/400.27 |
| 2013/0181640 | A1 | * | 7/2013 | Fukuta et al. ................. 318/139 |
| 2013/0229209 | A1 | * | 9/2013 | Miyauchi et al. ............. 327/109 |

FOREIGN PATENT DOCUMENTS

| CN | 101068096 A | 11/2007 |
| JP | 10-023743 A | 1/1998 |
| JP | 2001-314075 A | 11/2001 |
| JP | 2006324963 A | 11/2006 |
| JP | 2010-022190 A | 1/2010 |
| JP | 5056955 B2 | 10/2012 |

* cited by examiner

*Primary Examiner* — Lincoln Donovan
*Assistant Examiner* — Khareem E Almo
(74) *Attorney, Agent, or Firm* — Kenyon & Kenyon LLP

(57) ABSTRACT

A drive unit comprises a switching circuit and an abnormal signal generating circuit. The switching circuit is configured to be connected to an external time generating circuit, and is configured to switch a driving condition relating to a driving voltage of a voltage-driven element in a transitional period between a driving state and a non-driving state of the voltage-driven element based on a measurement time which is measured by using the time generating circuit. The abnormal signal generating circuit is configured to generate an abnormal signal when an accurate measurement of the time using the time generating circuit is not executed.

5 Claims, 6 Drawing Sheets

DRIVE UNIT FOR DRIVING VOLTAGE-DRIVEN ELEMENT

This is a 371 national phase application of PCT/JP2011/062720 filed 2 Jun. 2011, the contents of which are incorporated herein by reference.

TECHNICAL FIELD

The present invention relates to a drive unit for driving voltage-driven element.

BACKGROUND ART

A voltage-driven element is an element capable of performing a specific function using a driving voltage, and is widely used in various applications. In an example of the voltage-driven element, a voltage-driven switching element comprising an insulated gate is known. The voltage-driven switching element controls a current value based on a gate voltage (an example of the driving voltage) supplied to the insulated gate, and is used, e.g., in an inverter system that converts a direct current voltage to an alternating current voltage. A power semiconductor switching element that includes an IGBT (Insulated Gate Bipolar Transistor) and a MOSFET (Metal Oxide Semiconductor Field Effect Transistor) can be given as an example of the voltage-driven switching element.

In order to drive this type of the voltage-driven element, a drive unit is connected to the voltage-driven element. The drive unit is configured to control the driving voltage supplied to the voltage-driven element. For example, the drive unit can control the driving voltage based on a control signal that commands on/off of the voltage-driven element. The drive unit can also control the driving voltage based on a signal representing a driving state of the voltage-driven element, or a signal representing a state of the external environment.

As a driving method of such drive unit, a technique referred to an active gate driving method has been developed. The active gate driving method is characterized in that a driving condition relating to the driving voltage is changed during a transitional period between a driving state and a non-driving state of the voltage-driven element to improve both of a surge voltage and a switching loss. For example, when the voltage-driven element transits from the off-state to the on-state, one active gate driving method may be carried out such that a gate resistance is set to be high at an anterior half of the transitional period to make an ascent rate of the driving voltage be low and the gate resistance is set to be low at a later half of the transitional period to make the ascent rate of the driving voltage be high. Alternatively, when the voltage-driven element transits from the off-state to the on-state, another active gate driving method may be carried out such that the driving voltage is set to be low at the anterior half of the transitional period and the driving voltage is set to be high at the later half of the transitional period. Examples of such active gate driving methods are disclosed in JP App. Pub. No. 2010-022190, JP App. Pub. No. 2001-314075 or JP App. Pub. No. H10-23743.

SUMMARY OF INVENTION

Technical Problem

In such active gate driving method, it is important to manage an accurate timing for changing the driving condition. To manage the accurate timing for changing the driving condition, an accurate measurement of the time is needed. In general, since it is difficult for an internal circuit incorporated in the drive unit to execute the accurate measurement of the time, an external time generating circuit is used to measure the time.

However, when the external time generating circuit is used, a problem in an electrical connection between the drive unit and the time generating circuit is expected to occur for some reason. In such a case, the accurate timing for changing the driving condition is not managed, causing the voltage-driven element unable to be appropriately driven. The technique disclosed in this specification aims to provide a drive unit which deals with such problem.

Solution to Technical Problem

The drive unit disclosed in this specification is characterized in that an abnormal signal generating circuit is configured to generate an abnormal signal when an accurate measurement of the time is not executed due to the problem in the electrical connection between the drive unit and the time generating circuit. As a result, when the abnormal signal is generated, a protecting operation for the voltage-driven element can be performed.

DESCRIPTION OF EMBODIMENTS

Figure 1:
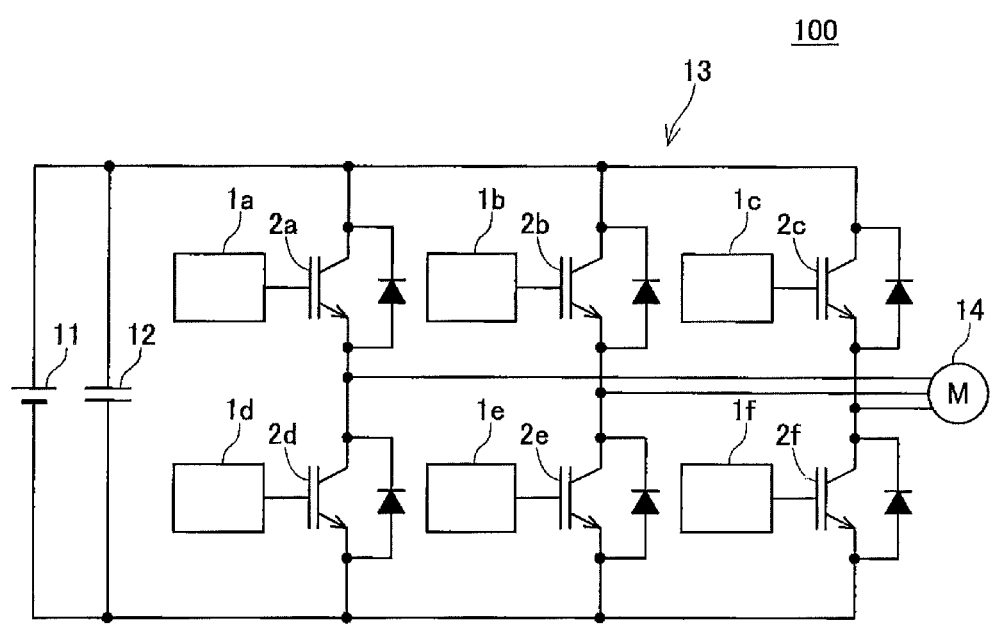
FIG. 1 shows one example of a configuration of an inverter system.

A drive unit taught in the present specification is used for driving a voltage-driven element. Here, the voltage-driven element is an element capable of performing a specific function using a driving voltage. The voltage-driven element may be a voltage-driven switching element having an insulated gate, and in particular may be a power semiconductor switching element. An IGBT, MOSFET, and thyristor may be included in the power semiconductor switching element.

A switching circuit of the drive unit taught in the present specification may be configured to be connected to an external time generating circuit, and may be configured to switch a driving condition relating to a driving voltage of the voltage-driven element during a transitional period between a driving state and a non-driving state of the voltage-driven element based on a measurement time which is measured by using the time generating circuit. For example, the switching circuit may include a switching performing circuit and a switching signal generating circuit. In this case, the switching performing circuit may be configured to switch the driving condition relating to the driving voltage of the voltage-driven element during the transitional period between the driving state and the non-driving state of the voltage-driven element in response to the switching signal from the switching signal generating circuit. The switching signal generating circuit may be configured to be connected to the external time generating circuit, and may be configured to provide the switching signal to the switching performing circuit based on the measurement time which is measured by using the time generating circuit.

The transitional period may be a turn-on period in which the voltage-driven element transits from the non-driving state (off-state) to the driving state (on-state), or may be a turn-off period in which the voltage-driven element transits from the driving state (on-state) to the non-driving state (off-state). The driving condition relating to the driving voltage includes, for example, a gate resistance, a gate capacitance or the driving voltage itself. The external time generating circuit includes, for example, a resistive element, a capacitor, a crystal oscillator or a ceramic oscillator. Here, various embodiments can be applied to the embodiment in which the switching circuit switches the driving condition. The switching circuit may switch the driving condition only based on the measurement time, or may alternatively switch the driving condition based on a logic which uses the measurement time as one requirement. Requirements other than the measurement time include a threshold voltage of the voltage-driven element, an ambient temperature, an element temperature, and a voltage between terminals of the voltage-driven element (a voltage between a collector and an emitter, or a voltage between a drain and a source). Also, a starting time of the measurement time may be, for example, a starting time of the transitional period, may be a time when the driving state of the voltage-driven element becomes a predetermined state, or may be a time when a state of an external environment becomes a predetermined state.

The abnormal signal generating circuit of the drive unit taught in the present specification may be configured to generate an abnormal signal when an accurate measurement of the time by using of the time generating circuit is not executed. The abnormal signal generated as aforementioned can be used for various purposes. In one example, the abnormal signal is used for a purpose of a protecting operation for the voltage-driven element. Or the abnormal signal is used to a protecting operation for other elements connected to the voltage-driven element. Specifically, the voltage-driven element may be forced to turn off on condition that the abnormal signal is generated.

The switching circuit taught in the present specification may be configured to measure the time after the transitional period Starts by using the time generating circuit, and may be configured to switch the driving condition when the measurement time reaches a first. predetermined time.

The switching circuit taught in the present specification may include a reference current source and a comparator. In this case, the reference current source is preferably configured to be connected to a capacitor disposed in the time generating circuit, and is preferably configured to provide a reference current to the capacitor after the transitional period starts. The comparator may be configured to be connected to the capacitor of the time generating circuit, and may be configured to determine that the measurement time reached the first predetermined time when a voltage on a connection line which is connected to the capacitor reaches a first threshold voltage. In this embodiment, since charge is accumulated on a high quality capacitor that is externally disposed, the accurate measurement of the time can be executed based on the accumulated charge amount.

A magnitude of the reference current of the reference current source taught in the present specification may be controlled by using a resistive element disposed in the time generating circuit. In this case, the abnormal signal generating circuit may preferably be configured to generate the abnormal signal at least when the magnitude of the reference current of the reference current source is at one of an upper threshold or higher and at a lower threshold or lower. In this embodiment, for example, an abnormal situation which is a problem on an electrical connection between the reference current source of the switching circuit and the resistive element of the time generating circuit can be detected.

The abnormal signal generating circuit taught in the present specification may be configured to measure the time after the transitional period starts, and may be configured to generate the abnormal signal when the voltage on the connection line which connects the comparator of the switching circuit to the capacitor of the time generating circuit has reached a second threshold voltage at a second predetermined time prior to the first predetermined time. Here, the first threshold voltage and the second threshold voltage may be same value. In this embodiment, for example, the abnormal situation in which a voltage on the connection line between the comparator and the capacitor rises earlier than it is expected due to a problem on the electrical connection between the comparator of the switching circuit and the capacitor of the time generating circuit can be detected.

The abnormal signal generating circuit taught in the present specification may be configured to measure the time after the transitional period starts, and may be configured to generate the abnormal signal when the driving condition is not switched at a third predetermined time later than the first predetermined time. In this embodiment, for example, the abnormal situation in which the voltage on the connection line between the comparator and the capacitor rises later than it is expected (or the voltage on the connection does not rise) due to a problem on the electrical connection between the comparator of the switching circuit and the capacitor of the time generating circuit can be detected.

The drive unit taught in the present specification may comprise a first connector, a second connector, a switching element, and a controller. The first connector is configured to be connected to a gate resistor of the voltage-driven element. The second connector is configured to be connected to a driving power source. A first input-output electrode of the switching element is connected to the first connector, and a second input-output electrode of the switching element is connected to the second connector. An example of the switching element may include a voltage-driven switching element having an insulated gate. The controller is connected to a control electrode of the switching element, and controls a voltage input to the control electrode of the switching element. The controller may include an error amplifier and a reference power source. One input connector of the error amplifier is connected to the reference power source, an other input connector of the error amplifier is connected to the first connector, and an output connector of the error amplifier is connected to the control electrode of the switching element. It is desirable for the error amplifier to be configured to amplify an error between the two input connectors and output it. An example of the error amplifier may include an operational amplifier. Further, another example of the error amplifier may include a circuit constituted of an A/D converter, a digital signal processing circuit, and a D/A converter.

In the drive unit in the present specification, it is preferable that the controller further includes a switch. One end of the switch is connected to the second connector, and an other end of the switch is connected to the control electrode of the switching element. In the drive unit, when the switch closes, the second input-output electrode of the switching element and the control electrode are short-circuited, thus the switching element turns off. Therefore, the supply of driving voltage to the voltage-driven element is stopped when the switch is closed. When the switch opens, the switching element turns on, and the driving voltage is supplied to the voltage-driven element. This drive unit is characterized in that the switch for switching the controller on/off is positioned between the second connector and the control electrode of the switching element, and not positioned on the feedback path. In general, since there is a mismatch of a resistance component in each of switches, there is a possibility that a feedback characteristic may also vary according to switches if such switches are provided on the feedback path. In this drive unit in the present specification, the switch for switching the controller on/off is not provided on the feedback path, thus the driving voltage supplied to the gate resistor of the voltage-driven element is controlled with the high precision.

In the drive unit in the present specification, the switch may open in synchrony with a turn-on of the voltage-driven element. Here, "in synchrony" typically includes the case of the time coinciding exactly within a range of control precision required by the voltage-driven element or drive unit. Further, "in synchrony" also includes the case of operation based on a common signal. "In synchrony" may include, e.g., the case where a signal commanding the switch to open/close and a signal commanding the voltage-driven element to be turned on are in common and, as long as those signals are in common, the term may even include the case where the time of making the switch open/close and the time of turning on the voltage-driven element do not coincide. The surge voltage and switching loss of the voltage-driven element strongly affect the switching speed of the voltage-driven element. Consequently, in order to improve the surge voltage and switching loss of the voltage-driven element, it is important to supply a high precision driving voltage at the time of turning on the voltage-driven element. By making the switch open in synchrony with the turn-on of the voltage-driven element, the drive unit can supply the high precision driving voltage in synchrony with the turn-on of the voltage-driven element. Consequently, the surge voltage and switching loss of the voltage-driven element can be improved.

Embodiment

Below, embodiments will be described with reference to the figures. Moreover, common components in the embodiments will have common reference numbers appended thereto, and an explanation thereof will be omitted.

FIG. 1 shows a basic configuration of an inverter system 100 mounted in a vehicle. The inverter system 100 comprises a DC power supply 11, a smoothing capacitor 12, and an inverter unit 13. The inverter unit 13 comprises six voltage-driven elements 2a-2f, and six drive units 1a-1f that drive the voltage-driven elements 2a-2f. An IGBT is used in the respective voltage-driven elements 2a-2f. The six voltage-driven elements 2a-2f constitute a three-phase bridge connection. Diodes used for return current are connected antiparallel to the respective voltage-driven elements 2a-2f. By switching a direct current voltage supplied from the DC power supply 11 via the smoothing capacitor 12, the inverter unit 13 changes the direct current voltage to an alternating current voltage and supplies the same to an alternating current motor 14. Since all of the six drive units 1a-1f have an equivalent circuit configuration, the six drive units 1a-1f will be described below without making a particular distinction between them.

First, with reference to FIG. 2, a basic configuration of the drive unit 1 that drives the voltage-driven element 2 will be explained. The drive unit 1 comprises a gate resistor Rg and a driving IC 3. The driving IC 3 is configured as one chip, and comprises a control circuit 4, a driving signal generating circuit 6, a switching performing circuit 5, a switching signal generating circuit 7 and an abnormal signal generating circuit 8. The switching performing circuit 5 and the switching signal generating circuit 7 are referred to as a switching circuit. The switching signal generating circuit 7 of the driving IC 3 is configured to be connected to a time generating circuit 9 which is disposed at an exterior portion.

The control circuit 4 is configured to control a driving voltage applied to the gate resistor Rg of the voltage-driven element 2 and switch the voltage-driven element 2 between a driving state (on-state) and a non-driving state (off-state) in response to a driving signal S1 supplied from an electronic control unit (ECU) (not shown).

Figure 3:
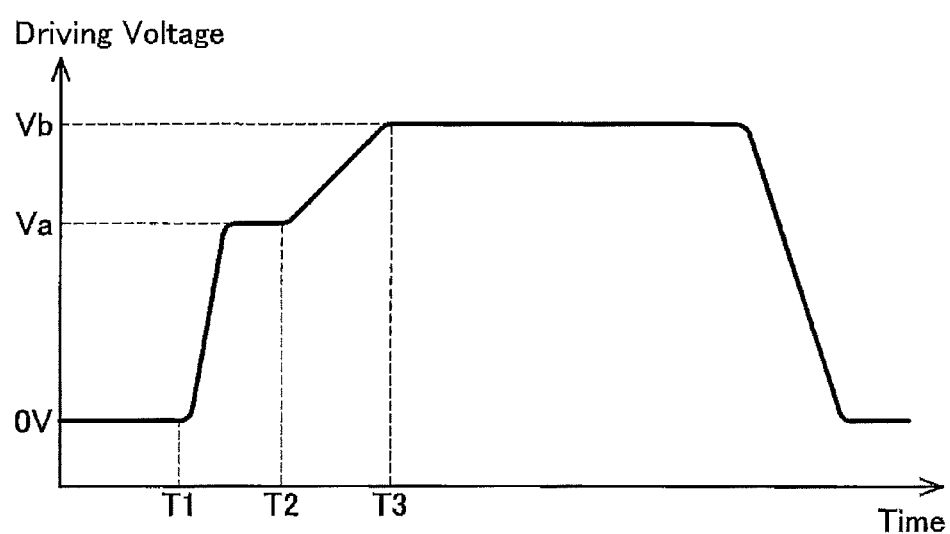
FIG. 3 shows one example of a transition of a driving voltage in a transitional period.

The switching performing circuit 5 is configured to switch a driving condition relating to the driving voltage of the voltage-driven element 2 in response to a switching signal S2 supplied from the switching signal generating circuit 7 during a transitional period in which the voltage-driven element 2 transits between the driving state (on-state) and the non-driving state (off-state). The switching operating circuit 5 in the present embodiment is configured to switch a magnitude of the driving voltage supplied to the gate resistor Rg of the voltage-driven element 2 during the transitional period in which the voltage-driven element 2 turns on. FIG. 3 shows one example of a transition of the driving voltage in this case. The transitional period of the turning on is from a timing T1 to a timing T3. The driving voltage is set at Va which is relatively low in an anterior half from the timing T1 to T2. The driving voltage is set at Vb which is relatively high in a later half from the timing T2 to T3. In this manner, the switching performing circuit 5 is configured to switch the magnitude of the driving voltage of the voltage-driven element 2 at timing T2.

Figure 2:
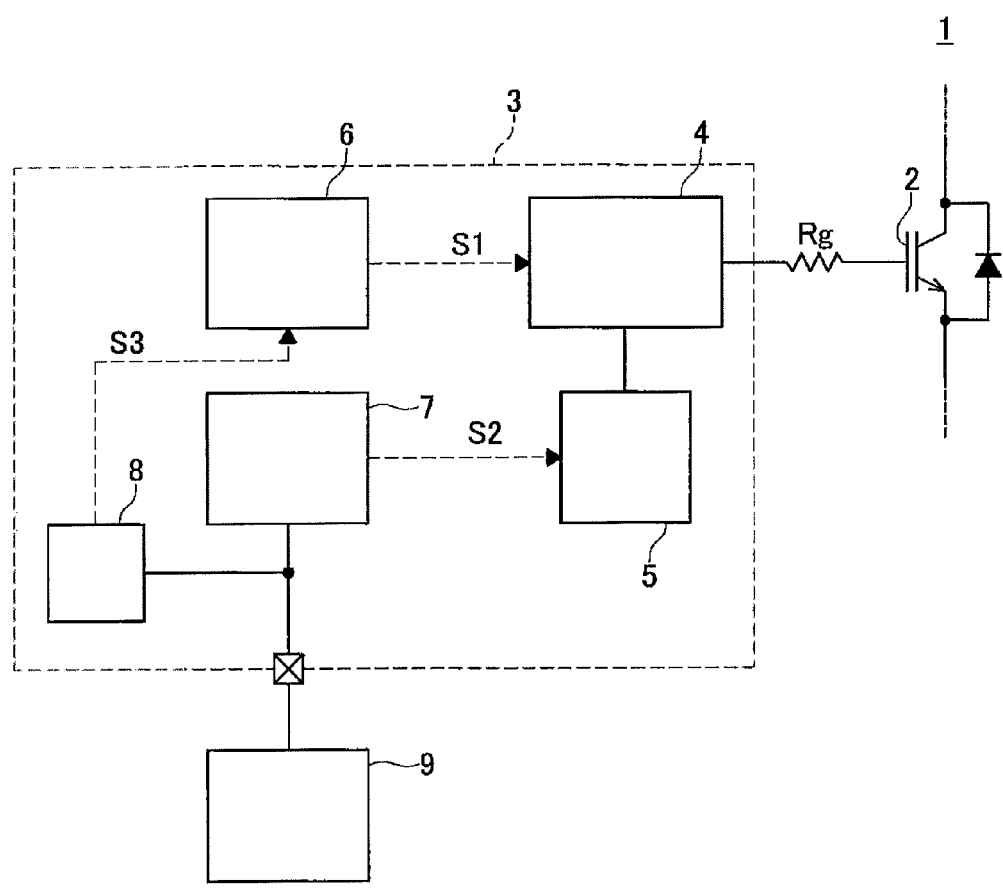
FIG. 2 shows one example of a brief configuration of a drive unit of an embodiment.

As depicted in FIG. 2, the switching signal generating circuit 7 is configured to be connected to the time generating circuit 9 which is disposed at the exterior portion of the driving IC 3. The switching signal generating circuit 7 is configured to measure the time after the transitional period starts, and is configured supply the switching signal S2 to the switching performing circuit 5 when the measurement time reaches a predetermined time (the timing T2 in the embodiment of FIG. 3).

The abnormal signal generating circuit 8 is configured to generate an abnormal signal S3 when an accurate measurement of the time by using of the switching signal generating circuit 7 is not executed due to a problem on an electrical connection between the switching signal generating circuit 7 and the time generating circuit 9. In one embodiment, the abnormal signal S3 is configured to input to the driving signal generating circuit 6. The driving signal generating circuit 6 works to protect the voltage-driven element 2 by stopping the generation of the driving signal S1 thereby to stop driving the voltage-driven element 2 when the abnormal signal S3 is input.

Next, with reference to FIG. 4, a detailed configuration of the drive unit 1 will be explained. Note that FIG. 4 shows an embodiment in which the magnitude of the driving voltage is switched only at the transitional period of the turning on of the voltage-driven element 2, however, the magnitude of the driving voltage, if needed, may be configured to be switched even at the transitional period of the turning off of the voltage-driven element 2.

Figure 4:
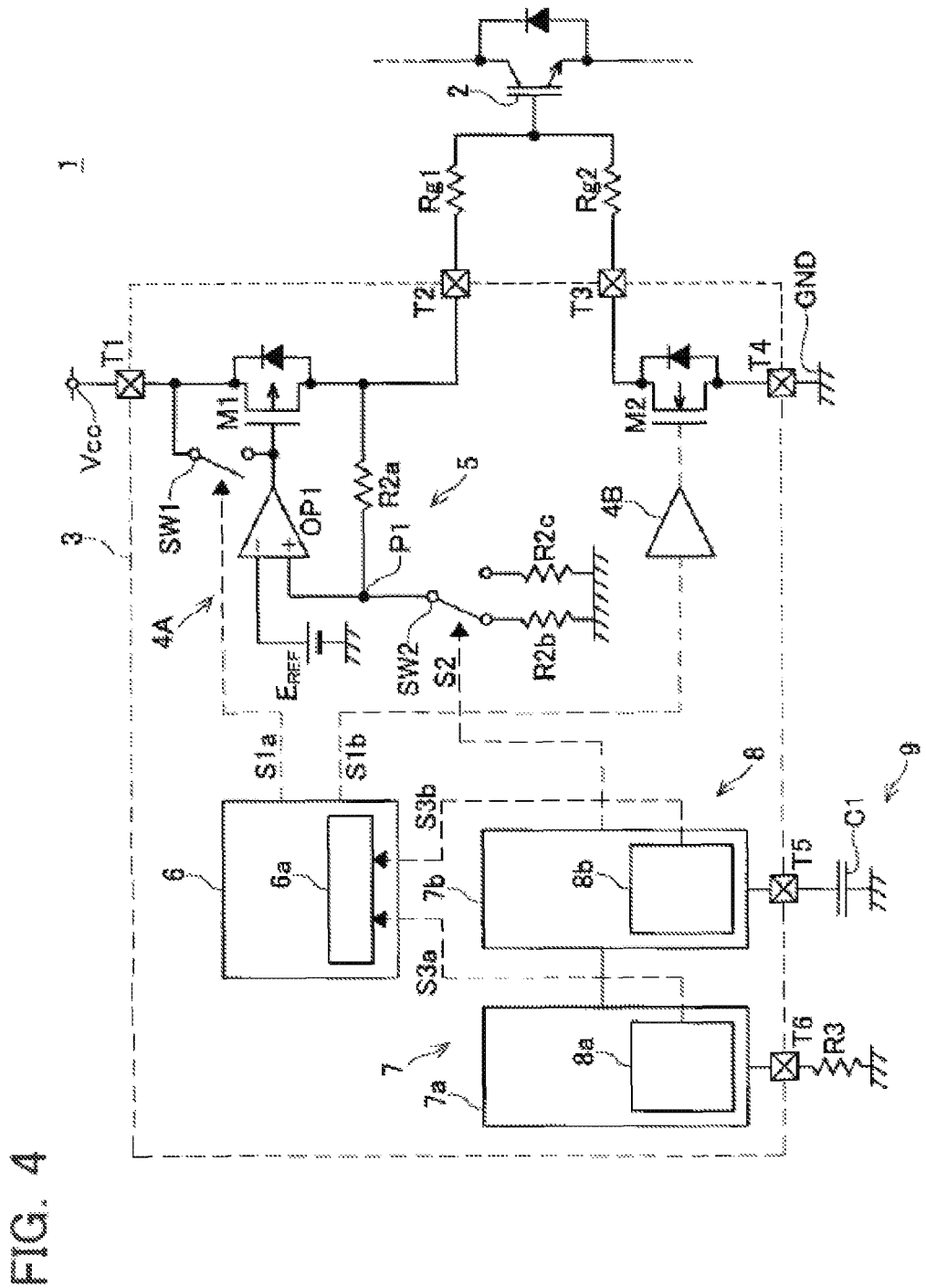
FIG. 4 shows one example of a configuration of the drive unit of the embodiment.

As depicted in FIG. 4, the drive unit 1 comprises a pair of gate resistors Rg1, Rg2 and the driving IC 3. The first gate resistor Rg1 is a fixed resistance element and determines the charging speed of the gate current of the voltage-driven element 2. The second gate resistor R2 is a fixed resistance element and determines the discharging speed of the gate current of the voltage-driven element 2.

The driving IC 3 is configured to be connected between a transformer type driving power source Vcc and a ground power source GND, and to supply the driving voltage to the pair of gate resistors Rg1, Rg2. The driving IC 3 comprises a pair of transistors M1, M2, a first controlling circuit 4A that controls the first transistor M1, a second controlling circuit 413 that controls the second transistor M2, the switching performing circuit 5 which is connected to the first controlling circuit 4A, the driving signal generating circuit 6 which supplies driving signal S1a, S1b to the first controlling circuit 4A and the second controlling circuit 4B, the switching signal generating circuit 7 which supplies the switching signal S2 to the switching performing circuit 5, the abnormal signal generating circuit 8 which supplies abnormal signals S3a, S3b to the driving signal generating circuit 6 and a plurality of terminals T1-T5. The terminal T1 is a power connector and is configured to be connected to the driving power source Vcc. The terminal T2 is a fist output connector and is configured to be connected to the first gate resistor Rg1. The terminal T3 is a second output connector and is configured to be connected to the second gate resistor Rg2. The terminal T4 is a ground connector and is configured to be connected to the ground power source GND. The terminal T5 is a count connector and is configured to be connected to a capacitor C1 of the time generating circuit 9. The terminal T6 is an external resistance connector and is configured to be connected to an external resistance element R3 of the time generating circuit 9.

The first transistor M1 is a p-type MOSFET, and is provided between the driving power connector T1 and the first output connector T2. More specifically, a source electrode of the first transistor M1 is connected to the power connector T1, and a drain electrode of the first transistor M1 is connected to the first output terminal T2. When the voltage-driven element 2 turns on, the first transistor M1 turns on, thereby supplying a positive driving voltage to the first gate resistor Rg1 of the voltage-driven element 2 from the driving power source Vcc via the first transistor M1.

The second transistor M2 is an n-type MOSFET, and is provided between the second output connector T3 and the ground connector T4. More specifically, a drain electrode of the second transistor M2 is connected to the second output terminal T3, and a source electrode of the second transistor M1 is connected to the ground connector T4. When the voltage-driven element 2 turns off, the second transistor M2 turns on, thereby supplying a ground voltage to the second gate resistor Rg2 of the voltage-driven element 2 via the second transistor M2.

The first controlling circuit 4A includes an operational amplifier OP1, a reference power source $E_{REF}$ and a switch SW 1. Note that a detailed explanation of the second controlling circuit 4B is omitted, however, the second controlling circuit 4B, if needed, may have similar configuration as the first controlling circuit 4A.

An inverting input terminal of the operational amplifier OP1 is connected to the reference power source $E_{REF}$, a non-inverting input terminal of the operational amplifier OP1 is connected to the first output connector T2 via the switching performing circuit 5, and an output terminal of the operational amplifier OP1 is connected to a control electrode of the first transistor M1. One end of the switch SW1 is connected to the power connector T1, and the other end of the switch SW1 is connected to the control electrode of the first transistor M1.

The switching operating circuit 5 includes voltage-dividing controlling resistors R2a, R2b, R2c and a switch SW2. Each of voltage-dividing controlling resistors R2a, R2b, R2c is a fixed resistance element. The second voltage-dividing controlling resistor R2b is different from the third voltage-dividing controlling resistor R2c in a fixed resistance value. The switch SW2 switches between statuses, wherein one status is that the first voltage-dividing controlling resistor R2a connects to the second voltage-dividing controlling resistor R2b, and another status is that the first voltage-dividing controlling resistor R2a connects to the third voltage-dividing controlling resistor R2c. A common connecting point P1 of voltage-dividing controlling resistors R2a, R2b, R2c is connected to the non-inverting input terminal of the operational amplifier OP1. The switching performing circuit 5 can switch a voltage-dividing ratio by switching the switch SW2. Thereby, as mentioned bellow, a target voltage of the first output connector T2 can be switched.

The driving signal generating circuit 6 outputs a first driving signal S1a to the first controlling circuit 4A and outputs a second driving signal S1b to the second controlling circuit 4B based on a controlling signal supplied from an electronic control unit (ECU) (not shown). The driving signal generating circuit 6 includes a protecting circuit 6a. The protecting circuit 6a is configured to input abnormal signals S3a, S3b from the abnormal signal generating circuit 8, and is configured to stop to generate driving signal S1a, S1b in response to abnormal signals S3a, S3b.

The switching signal generating circuit 7 includes a reference current generating member 7a and a timing generating member 7b. The reference current generating member 7a is configured to be connected to the timing generating member 7b and the external resistor element R3 of the time generating circuit 9, and provides a reference current which is changed based on a resistance value of the external resistance element R3 to the timing generating member 7b. The timing generating member 7b is configured to be connected to the capacitor C1 of the time generating circuit 9, and provides the reference current from the reference current generating member 7b to the capacitor C1. The timing generating member 7b is configured to generate the switching signal S2 based on a voltage depending on charge accumulated on the capacitor C1. That is, since an increasing of charge amount on the capacitor C1 correspond to a course of time, the timing generating member 7b measures the time based on charge amount on the capacitor C1 and generates the switching signal S2 when the predetermined time passes.

The abnormal signal generating circuit 8 includes a reference current monitoring member 8a and a time monitoring member 8b. The reference current monitoring member 8a monitors the reference current generated in the reference current generating member 7a and supplies the abnormal signal S1a to the protecting circuit 6a of the driving signal generating circuit 6 when a value of the reference current is larger than a predetermined value. The time monitoring member 8b monitors whether an accurate measurement of the time in the switching signal generating circuit 7 is executed, and supplies the abnormal signal S1b to the protecting circuit 6a of the driving signal generating circuit 6 when the accurate measurement of the time is not executed.

Next, the operation in which the drive unit 1 turns on will be described. When the switch SW1 opens due to an input of the first driving signal S1a from the driving signal generating circuit 6, the first transistor M1 turns on. At this time, in the second controlling circuit 4B, the second transistor M2 turns off due to the second driving signal S2 output from the driving signal generating circuit 6. When the first transistor M1 turns on, a positive driving voltage is supplied to the first gate resistor Rg1 from the driving power source Vcc via the first transistor M1. A voltage on the first output connector T2 divided by the switching performing circuit 5 (i.e. the driving voltage, which is supplied to the first gate resistor Rg1, divided by the switching performing circuit 5) is input to the non-inverting input terminal of the operational amplifier OP1, and the reference voltage $V_{REF}$ of the reference power source $E_{REF}$ is input to the inverting input terminal. Consequently, the first controlling circuit 4A compares the divided voltage on the first output connector T2 divided by the switching performing circuit 5 with the reference voltage $V_{REF}$ and, based on the results of this comparison, controls a gate voltage input to the first transistor M1. Consequently, the voltage on the first output connector T2 is maintained such that it conforms, according to a dividing-voltage ratio, to the reference voltage of the reference power source $E_{REF}$.

The switching signal generating circuit 7 measures the time after the voltage-driven element 2 starts to turn on (see the timing T3 in FIG. 3), and supplies the switching signal S2 to the switching performing circuit 5 when the measurement time reaches a predetermined time (see the timing T2 in FIG. 3). The switching performing circuit 5 switches the switch SW2 in response to the switching signal S2. The switching performing circuit 5 switches from the high resistance second voltage-dividing resistor R2b to the low resistance third voltage-dividing resistor R2c so that the dividing-voltage ratio is switched. Consequently, the voltage which is input to the non-inverting input terminal of the operational amplifier OP1 becomes low, then, the target voltage switches from low level to high level (see the driving voltage Va, Vb in FIG. 3).

In the drive unit 1 in the present specification, the surge voltage is repressed due to the low driving voltage at the latter half of the transitional period of the turn-on, and the switching loss is decreased due to the high driving voltage at the latter half of the transitional period of the turn-on. As mentioned above, in the present embodiment, both of the surge voltage and the switching loss are improved by switching the magnitude of the driving voltage during the transitional period of the turn-on.

Here, in order to effectively improve both of the surge voltage and the switching loss, the accurate timing measurement for switching the magnitude of the driving voltage during the transitional period of the turn-on is needed. For example, the switching timing is earlier, the voltage-driven element 2 is driven by the high driving voltage at earlier phase of the transitional period so that the surge voltage increases. If such situation remains, a durability of the voltage-driven element 2 may become low. In the drive unit 1 in the present embodiment, the time measurement is executed by using of the external resistance element and the capacitor of the time generating circuit 9 which is disposed at the exterior portion, therefore, an extremely accurate time measurement is realized.

Further, when an accuracy of the switching timing is worse due to the problem on electrical connection between the driving IC 3 and the external time generating circuit 9, the drive unit 1 in the present embodiment is configured to protect the voltage-driven element 2 by generating the abnormal signal.

Figure 5:
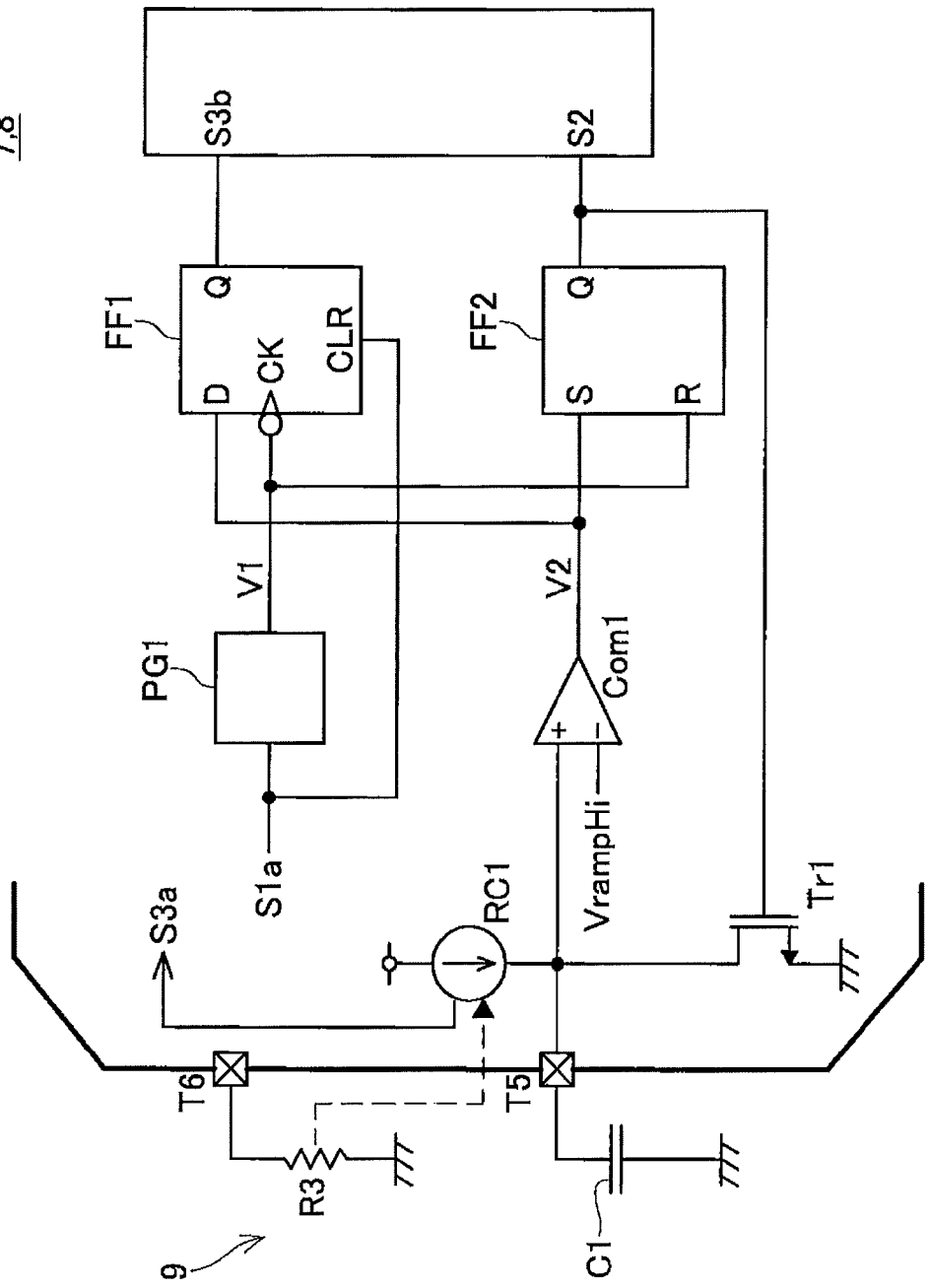
FIG. 5 shows one example of a configuration of a signal generating circuit of the embodiment.

FIG. 5 shows one example of detailed configurations of the switching signal generating circuit 7 and the abnormal signal generating circuit 8 of the present embodiment. Note that some composition elements depicted in FIG. 5 are used for generating the switching signal S2 and also are used for generating the abnormal signal S3b. Therefore, some composition elements belong to both of the switching signal generating circuit 7 and the abnormal signal generating circuit 8. Below, the switching signal generating circuit 7 and the abnormal signal generating circuit 8 will be explained as a signal generating circuit 7, 8 without any distinction between the switching signal generating circuit 7 and the abnormal signal generating circuit 8.

The signal generating circuit 7, 8 includes a reference current source RC1, comparator Com1, transistor Tr1, a pulse generator PG1, D-type flip-flop FF1 and RS-type flip-flop FF2. The reference current of the reference current source RC1 is controlled by the external resistance element R3 which is disposed at the external portion. A current detecting circuit (not shown) is connected to the reference current source RC1. For example, when the external resistance connector T6 is short-circuited, the reference current which the reference current source RC1 generates becomes larger. The current detecting circuit compares the reference current with an upper threshold. When the reference current is equal to or higher than the upper threshold, the current detecting circuit determines that the external resistance connector T6 is short-circuited, and generates the abnormal signal S1a.

One end of the reference current source RC1 is connected to the capacitor C1, an inverting input terminal of the comparator Com1 and a drain of the transistor Tr1. A threshold voltage VrampHi corresponding to the switching predetermined time is input to a non-inverting input terminal of the comparator Com1.

The first driving signal S1a is input to the pulse generator PG1 and a clear connector of a D-type flip-flop FF1. The pulse generator PG1 generates an output V1 as high during a predetermined period after the first driving signal S1a falls. In one embodiment, the pulse generator PG1 generates an output V1 as high during 400 nanoseconds after the first driving signal S1a falls. The output V1 of the pulse generator PG1 is inverted and then is input to a clock connector of the D-type flip-flop FF1. Further, the output V1 of the pulse generator PG1 is input to an R-connector of an RS-type flip-flop FF2. The output V2 of the comparator Com1 is input to a D-connector of the D-type flip-flop FF1 and, an S-connector of the RS-type flip-flop FF2. An output of the RS-type flip-flop FF2 is input to a controlling electrode of the transistor Tr1.

Figure 6:
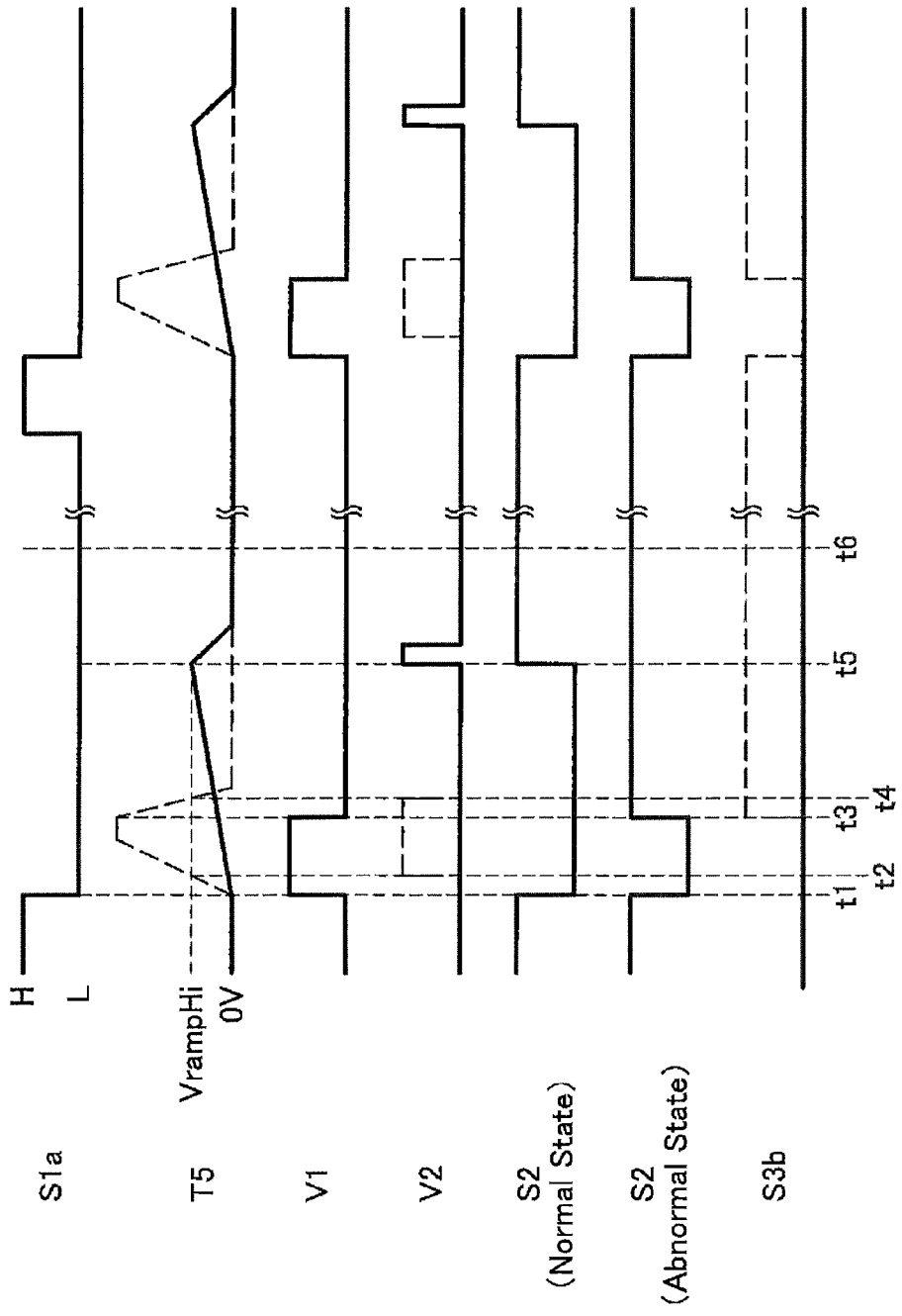
FIG. 6 shows one example of a timing chart of the signal generating circuit of the embodiment.

Next, with reference to FIG. 6, the operation of the voltage-driven element 2 in the transitional period of the turn-on will be explained. First, the operation at the normal state will be explained. As shown in FIG. 6, the first driving signal S1a changes from high to low at timing t1. The first driving signal S1a is a low active. When the first driving signal S1a changes from high to low, the pulse generator PG1 generates the output V1 as high during the predetermined period (400 nanoseconds).

When the first driving signal S1a becomes low at the timing t1, the reference current starts to flow from the reference current source RC1 to the capacitor C1 so that the charge is accumulated on the capacitor C1. Due to the accumulation of the charge on the capacitor C1, the voltage on the count connector T5 rises (the normal status is depicted with the solid line). When the voltage on the count connector T5 reaches the threshold voltage VrampHi, the output V2 of the comparator Com1 changes from low to high. At this time, the output V1 of the pulse generator PG1 which is input to the R-connector of the RS-type flip-flop FF2 becomes low because the predetermined period (400 nanoseconds) has already passed. Therefore, when the output V2 of the comparator Coral changes from low to high, the output of the RS-type flip-flop FF2 becomes high so that the switching signal S2 is output. Further, when the switching signal S2 is output, the transistor Tr1 turns on and the charge on the capacitor C1 is discharged. In this manner at the normal status, since a supply rate of the charge from the reference current source RC1 to the capacitor is accurate and an ascending rate of the voltage based on the charge amount on the capacitor is also accurate, it is possible to accurately measure the predetermined time t5 which has been set.

Next, the operation in the abnormal state will be explained. Below, the example of abnormal statuses which the count connector T5 opens or the external resistance connector T6 is short-circuited will be explained. As shown in FIG. 6, when the first driving signal S1a changes from high to low at timing t1, the pulse generator PG1 generates the output V1 as high during the predetermined period (400 nanoseconds). In the abnormal status in which the count connector T5 opens or the external resistance connector T6 is short-circuited, the voltage on the count connector T5 rapidly rises (the abnormal status is depicted with the broken line). Therefore, the voltage on the count connector T5 reaches the threshold voltage VrampHi at the timing t2, and the output V2 of the comparator Com1 changes from low to high. When the output V2 of the RS-type flip-flop FF2 changed from high to low at the timing t3 due to the passage of the predetermined period (400 nanoseconds), the output V2 of the comparator Com1 has already been high. Therefore, the output of the RS-type flip-flop FF2 becomes high at the timing t3 so that the abnormal signal S3b is output. In this manner, in the abnormal status in which the count connector T5 opens or the external resistance connector T6 is short-circuited, the abnormal signal S3b is output and the protection operation for the voltage-driven element 2 is executed.

Further, in the case of the abnormal status in which the count connector 15 opens or the external resistance connector T6 is short-circuited, the voltage on the count connector 15 hardly rises. In such abnormal status, the output of the comparator Com1 remains low, and the switching signal S2 also remains low. For example, as shown in FIG. 6, when the switching signal S2 is low at the timing t6 which is later than the predetermined switching timing t5, it can be determined that the abnormal status in which the count connector T5 opens or the external resistance connector T6 is short-circuited has occurred. In such case, the abnormal signal may be output and the protecting operation for the voltage-driven element 2 may be executed. Further, in the case where a reset of the capacitor is synchronized with a rise of the first driving signal S1a, the voltage on the count connector T5 is higher than the threshold voltage VrampHi at the normal status and is lower than the threshold voltage VrampHi at the abnormal status. According to this difference, the occurrence of the abnormal status in which the count connector T5 opens or the external resistance connector T6 is short-circuited can be determined.

Specific examples of the present invention are described above in detail, but these examples are merely illustrative and place no limitation on the scope of the patent claims. The technology described in the patent claims also encompasses various changes and modifications to the specific examples described above.

The technical elements explained in the present specification or drawings provide technical utility either independently or through various combinations. The present invention is not limited to the combinations described at the time the claims are filed. Further, the purpose of the examples illustrated by the present specification or drawings is to satisfy multiple objectives simultaneously, and satisfying any one of those objectives gives technical utility to the present invention.

The invention claimed is:

1. A drive unit for driving a voltage-driven element, the drive unit comprising:
   a switching circuit; and
   an abnormal signal generating circuit, wherein
   the switching circuit is configured to be connected to an external time generating circuit, and is configured to switch a driving condition relating to a driving voltage of the voltage-driven element during a transitional period between a driving state and a non-driving state of the voltage-driven element based on a measurement time which is measured by using the time generating circuit, and
   the abnormal signal generating circuit is configured to generate an abnormal signal when an accurate measurement of the time using the time generating circuit is not executed,
   the switching circuit is configured to measure the time after the transitional period starts by using the time generating circuit, and is configured to switch the driving condition when the measurement time reaches a first predetermined time,
   the switching circuit includes a reference current source and a comparator,
   the reference current source is configured to be connected to a capacitor disposed in the time generating circuit, and is configured to provide a reference current to the capacitor after the transitional period starts, and
   the comparator is configured to be connected to the capacitor of the time generating circuit, and is configured to determine that the measurement time reached the first predetermined time when a voltage on a connection line which is connected to the capacitor reaches a first threshold voltage.

2. The drive unit according to claim 1, wherein
   a magnitude of the reference current of the reference current source is controlled by using a resistive element disposed in the time generating circuit, and
   the abnormal signal generating circuit is configured to generate the abnormal signal at least when the magnitude of the reference current of the reference current source is at one of an upper threshold or higher and a lower threshold or lower.

3. The drive unit according to claim 1 wherein
   the abnormal signal generating circuit is configured to measure the time after the transitional period starts, and is configured to generate the abnormal signal when the voltage on the connection line which connects the comparator of the switching circuit to the capacitor of the time generating circuit has reached a second threshold voltage at a second predetermined time prior to the first predetermined time.

4. The drive unit according to claim 3, wherein
   the first threshold voltage and the second threshold voltage are same value.

5. The drive unit according to claim 1 wherein
   the abnormal signal generating circuit is configured to measure the time after the transitional period starts, and is configured to generate the abnormal signal when the driving condition is not switched at a third predetermined time later than the first predetermined time.

\* \* \* \* \*

UNITED STATES PATENT AND TRADEMARK OFFICE
CERTIFICATE OF CORRECTION

| | |
|---|---|
| PATENT NO. | : 8,866,515 B2 |
| APPLICATION NO. | : 13/882594 |
| DATED | : October 21, 2014 |
| INVENTOR(S) | : Masaki Wasekura |

It is certified that error appears in the above-identified patent and that said Letters Patent is hereby corrected as shown below:

In the Specification

At column 1, lines 10-11, change "driving voltage-driven element" to -- driving a voltage-driven element --.

At column 3, line 45, change "period Starts by" to -- period starts by --.

At column 7, line 10, change "circuit 413 that" to -- circuit 4B that --.

At column 7, line 53, change "SW 1" to -- SW1 --.

At column 8, line 51, change "signal S1a" to -- signal S3a --.

At column 8, line 56, change "signal S1b" to -- signal S3b --.

At column 10, line 18, change "signal S1a" to -- signal S3a --.

At column 10, line 61, change "comparator coral changes" to -- comparator com1 changes --.

At column 11, line 29, change "connector 15 opens" to -- connector T5 opens --.

At column 11, line 30, change "connector 15 hardly" to -- connector T5 hardly --.

In the Claims

At column 12, line 44, (claim 3) change "according to claim 1 wherein" to -- according to claim 1, wherein --.

At column 12, line 57, (claim 5) change "according to claim 1 wherein" to -- according to claim 1, wherein --.

Signed and Sealed this
Fourteenth Day of July, 2015

Michelle K. Lee
*Director of the United States Patent and Trademark Office*